(12) United States Patent
Wakui

(10) Patent No.: US 6,327,026 B1
(45) Date of Patent: Dec. 4, 2001

(54) EXPOSURE APPARATUS AND POSITIONING APPARATUS

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/271,159

(22) Filed: Mar. 17, 1999

(30) Foreign Application Priority Data

Mar. 20, 1998 (JP) .................................................. 10-072221

(51) Int. Cl.$^7$ ............................ G03B 27/58; G03B 27/42; G03B 27/62
(52) U.S. Cl. .................................. 355/72; 355/75; 355/53
(58) Field of Search ....................... 355/53, 53.1, 53.12, 355/53.14, 53.16, 53.17, 72, 75; 74/490.09; 108/145

(56) References Cited

U.S. PATENT DOCUMENTS

| | | | |
|---|---|---|---|
| 5,005,492 | * 4/1991 | Ogino et al. ........................ | 297/344.4 |
| 5,151,008 | * 9/1992 | Ishida et al. ....................... | 414/744.5 |
| 5,277,539 | * 1/1994 | Matsui et al. ......................... | 414/735 |
| 5,477,743 | * 12/1995 | Yanagisawa ....................... | 74/490.09 |
| 5,568,032 | 10/1996 | Wakui ................................. | 318/632 |
| 5,653,317 | 8/1997 | Wakui .................................. | 188/378 |
| 5,746,138 | * 5/1998 | Hirose .................................. | 108/145 |
| 5,973,776 | * 10/1999 | Matsushita .......................... | 356/237.4 |

OTHER PUBLICATIONS

Uchiyama, et al., "Dynamic Control Experiment on a Parallel Robot HEXA", *Transactions of Robotics Society of Japan*, vol. 14, No. 2, pp. 143–150 (Mar. 1996).

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

An exposure apparatus for exposing and transferring a reticle pattern to a photosensitive substrate includes a table for holding the reticle or photosensitive substrate, and a parallel link mechanism for positioning the table. An apparatus for positioning first and second objects relative to each other includes a first parallel link mechanism for holding and moving the first object, and a second parallel link mechanism for holding and moving the second object. The first and second parallel link mechanisms are supported by a common base plate. The base plate supports a third object. The first and second objects are positioned with respect to the third object.

26 Claims, 8 Drawing Sheets

EXPOSURE APPARATUS AND POSITIONING APPARATUS

BACKGROUND OF THE INVENTION

1. Field of the Invention

The present invention relates to an exposure apparatus for exposing and transferring, e.g., a reticle pattern onto a photosensitive substrate in the photolithography process for manufacturing a device such as a semiconductor device, an image sensing device such as a CCD (Charge-Coupled Device), a liquid crystal display device, or a thin-film magnetic head, and a positioning apparatus and, more particularly, to an exposure apparatus having a parallel link mechanism capable of supporting a semiconductor wafer, accurately positioning it, and conveying it at high speed.

2. Description of the Related Art

The structure of the positioning mechanism of a conventional semiconductor exposure apparatus will be described with reference to FIG. 7. Referring to FIG. 7, reference numeral 102 denotes a fine moving stage mounted on an X stage 110 to finely position a semiconductor wafer 103; 104, a Y stage; 105R and 105L, moving magnet type movable elements of a linear motor for position-controlling the Y stage 104; 106R and 106L, coils as the stators of the linear motor; 107, a stage base plate; and 108, a main body base plate supported by active support legs 109a to 109d constituting an active anti-vibration device. The support legs 109b, 109c, and 109d are arranged at three corners of the main body base plate 108, other than the corner with the support leg 109a, although they are not illustrated in FIG. 7.

An X-Y stage 101 will be described first. The X stage 110 receives a thrust from a linear motor (not shown) and is position-controlled in the X direction of a coordinate system shown in FIG. 7 on the basis of a position signal measured by irradiating a moving mirror 111X with a laser beam from a laser interferometer. The Y stage 104 is applied with a thrust by a current supplied from the movable elements 105R and 105L of linear motors disposed on the left and right sides to the coils 106R and 106L, and is position-controlled in the Y direction of the coordinate system on the basis of a position signal measured by irradiating a moving mirror 111Y with a laser beam from a laser interferometer.

The fine moving stage 102 will be described next. Three actuators (not shown) for generating thrusts vertically in the Z direction and an actuator for rotating the fine moving stage 102 about the Z-axis are arranged to construct a mechanism for controlling translation in the direction of the optical axis, i.e., Z-axis of the projection optical system, rotation about the X- and Y-axes as the coordinate axes which are located in a horizontal plane perpendicular to the optical axis, and rotation about the Z-axis. As the actuator, a piezoelectric element or a linear motor is preferably used. A position sensor for positioning the fine moving stage 102 is placed at the periphery under the fine moving stage 102, though it is not illustrated.

As described above, with the X-Y stage 101 and fine moving stage 102, the semiconductor wafer 103 can be moved in the two-dimensional plane at a high speed and set at a desired position, and then, focusing along the optical axis of a projecting lens (not shown) and leveling drive at a tilt with respect to the optical axis can be performed. More specifically, the X-Y stage 101 performs positioning with a total of two-degrees-of-freedom, i.e., X and Y translation operations, and the fine moving stage 102 performs positioning with a total of four-degrees-of-freedom, i.e., Z translation along the optical axis, rotation about the X-axis, rotation about the Y-axis, and rotation about the Z-axis. That is, motion with a total of six-degrees-of-freedom is controlled.

Recently, a mechanism called a parallel link mechanism has been introduced. It has received a great deal of attention as a mechanism having high rigidity and capable of high-speed drive, as compared to a serial link scheme used for a conventional robot arm. For example, a machine tool requires a drive mechanism having high rigidity to withstand working disturbance. Employment of parallel link mechanisms to such tools starts aiming at realization of high-speed working. Practical industrial robots which can be used for welding, assembly, handling, or the like have been produced recently. These are known industrial robots described in Uchiyama, Sadoyu, and Masukawa, "Dynamic Control Experiments of Parallel Robot HEXA", Transactions of Robotics Society of Japan, Vol. 14, No. 2, pp. 143–150 (1996).

FIG. 8 shows an example of the parallel link mechanism. The mechanical structure and operation will be described.

Referring to FIG. 8, reference numeral 119 denotes a movable plate; 120, a fixed plate; 121, spherical bearings attached to the movable and fixed plates, respectively; and 122, a extendible actuator unit. As the extendible actuator 122, a hydraulic actuator, an air cylinder, a combination of a motor and a ball screw, or a motor, reduction gears, and a ball screw, or a linear motor is used. The spherical bearings 121 and actuator 122 unit construct a link 123. In the parallel link mechanism shown in FIG. 8, the movable plate 119 and fixed plate 120 are connected with a total of six links. By controlling the extension/retraction amount of each link 123, the posture of the coordinate system $(x_1,y_1,z_1)$ of the movable plate 119, which has six-degrees-of-freedom, with respect to the coordinate system $(x_2,y_2,z_2)$ defined for the fixed plate 120 can be arbitrarily set.

The actuator unit 122 of each link 123 incorporates a standard position sensor (not shown). In addition, each link may have at least one of a speed sensor and an acceleration sensor as needed.

A conventional exposure apparatus has an X-Y stage for moving a semiconductor wafer in a horizontal two-dimensional plane at a high speed to set the wafer at a predetermined position and a focus/leveling stage, i.e., a fine moving stage for moving the semiconductor wafer in the direction of the optical axis of a projecting lens and adjusting the tilt. That is, in the conventional exposure apparatus, the heavy X-Y and fine moving stages are driven to convey a semiconductor wafer with a small weight of several hundred grams. Since the heavy and complex mechanism is driven as a whole, it can be understood that a very inefficient motion mechanism is used from the viewpoint of energy consumption. To achieve a higher-speed operation in the conventional exposure apparatus, the thrust of the linear motor (FIG. 7) needs to be increased. However, an increase in thrust results in a bulky drive mechanism and inevitably poses a serious problem of heat generation.

In a conventional parallel link mechanism, a position sensor or the like is arranged in each actuator unit. The movable plate to be positioned by the parallel link mechanism is feedback-controlled on the basis of the sensor output. However, when an object mounted on the movable plate is to be accurately positioned, e.g., when positioning is to be performed on the submicrometer order, it is difficult to accurately position the object on the movable plate by only positioning using the sensors of the actuators.

SUMMARY OF THE INVENTION

It is an object of the present invention to improve the throughput of an exposure apparatus such as a stepper without making, e.g., the drive mechanism bulky. This object can be achieved by the following exposure apparatus.

According to the first aspect of the present invention, there is provided an exposure apparatus for transferring a reticle pattern to a substrate, comprising a plate for supporting the substrate or reticle, and a parallel link mechanism for positioning the plate.

The exposure apparatus according to the first aspect of the present invention preferably further comprises, for example, a base plate for supporting the parallel link mechanism.

The exposure apparatus according to the first aspect of the present invention preferably further comprises, for example, a damper for supporting the base plate.

The exposure apparatus according to the first aspect of the present invention preferably further comprises, for example, a measurement device for measuring a position of the plate, and a drive section for driving the parallel link mechanism on the basis of a measurement result by the measurement device.

In the exposure apparatus according to the first aspect of the present invention, the measurement device further comprises, for example, a reflecting mirror fixed to the plate, and an interferometer paired with the reflecting mirror.

In the exposure apparatus according to the first aspect of the present invention, the interferometer is preferably fixed to, for example, the base plate for supporting the parallel link mechanism.

In the exposure apparatus according to the first aspect of the present invention, the parallel link mechanism preferably comprises, for example, a plurality of actuators, and at least one of a position sensor, a speed sensor, and an acceleration sensor.

In the exposure apparatus according to the first aspect of the present invention, the actuator preferably has, for example, one of a extendible mechanism and a rotation mechanism.

In the exposure apparatus according to the first aspect of the present invention, preferably, for example, the parallel link mechanism has a plurality of actuators, and the exposure apparatus further comprises a cooling unit for cooling the plurality of actuators.

In the exposure apparatus according to the first aspect of the present invention, the cooling unit preferably comprises, for example, an air cooling unit.

In the exposure apparatus according to the first aspect of the present invention, for example, the air cooling unit preferably supplies a gas from one side of the parallel link mechanism to the parallel link mechanism.

In the exposure apparatus according to the first aspect of the present invention, for example, the plate is preferably formed from a ceramic.

According to the second aspect of the present invention, there is provided an exposure apparatus for transferring a reticle pattern to a substrate, comprising a first plate for supporting the reticle, a second plate for supporting the substrate, a first parallel link mechanism for positioning the first plate, and a second parallel link mechanism for positioning the second plate.

In the exposure apparatus according to the second aspect of the present invention, for example, the first and second parallel link mechanisms are preferably supported by a lens-barrel base plate for supporting a projection optical system.

The exposure apparatus according to the second aspect of the present invention preferably further comprises, for example, a damper for supporting the lens-barrel base plate.

According to the third aspect of the present invention, there is provided an exposure apparatus for transferring a reticle pattern to a substrate, comprising a movable plate for supporting the substrate, a parallel link mechanism for positioning the plate, a fixed plate for supporting the parallel link mechanism, a projection optical system, a lens-barrel base plate for supporting the projection optical system, and a damper for preventing vibration transmission between the fixed plate and the lens-barrel base plate.

It is another object of the present invention to increase the speed and accuracy of operation of a positioning apparatus.

According to the fourth aspect of the present invention, there is provided a positioning apparatus for positioning first and second objects, comprising a first plate for supporting the first object, a second plate for supporting the second object, a first parallel link mechanism for positioning the first plate, a second parallel link mechanism for positioning the second plate, and a common base plate for supporting the first and second parallel link mechanisms.

The positioning apparatus according to the fourth aspect of the present invention preferably further comprises, for example, a first measurement device for measuring a position of the first plate, a second measurement device for measuring a position of the second plate, a first drive section for driving the first parallel link mechanism on the basis of a measurement result by the first measurement device, and a second drive section for driving the second parallel link mechanism on the basis of a measurement result by the second measurement device, and the first and second measurement devices measure the positions of the first and second plates with reference to the common base plate, respectively.

In the positioning apparatus according to the fourth aspect of the present invention, each of the first and second measurement devices preferably has, for example, an interferometer.

In the positioning apparatus according to the fourth aspect of the present invention, the first and second plates are preferably formed from a ceramic.

In the positioning apparatus according to the fourth aspect of the present invention, preferably, for example, the first object comprises a reticle, and the second object comprises a substrate.

In the positioning apparatus according to the fourth aspect, the common base plate preferably comprises, for example, a lens-barrel base plate for supporting a projection optical system.

In the positioning apparatus according to the fourth aspect, for example, each of the first and second parallel link mechanisms preferably has a plurality of actuators, and the positioning apparatus further comprises a cooling unit for cooling the plurality of actuators.

In the positioning apparatus according to the fourth aspect, the cooling unit preferably comprises, for example, an air cooling unit.

In the positioning apparatus according to the fourth aspect, for example, the air cooling unit preferably supplies a gas from one side of the first and second parallel link mechanisms to the first and second parallel link mechanisms.

According to the fifth aspect of the present invention, there is provided a positioning apparatus comprising a plate for supporting an object to be positioned, a parallel link mechanism for positioning the plate, a measurement device for measuring a position of the plate outside the parallel link mechanism, and a drive section for driving the parallel link mechanism on the basis of a measurement result by the measurement device.

In the positioning apparatus according to the fifth aspect of the present invention, the measurement device preferably comprises, for example, a reflecting mirror fixed to the plate, and an interferometer paired with the reflecting mirror.

In the positioning apparatus according to the fifth aspect of the present invention, the plate is preferably formed from, for example, a ceramic.

In the positioning apparatus according to the fifth aspect, preferably, for example, the parallel link mechanism has a plurality of actuators, and the positioning apparatus further comprises a cooling unit for cooling the plurality of actuators.

In the positioning apparatus according to the fifth aspect, the cooling unit preferably comprises, for example, an air cooling unit.

In the positioning apparatus according to the fifth aspect, for example, the air cooling unit preferably supplies a gas from one side of the parallel link mechanism to the parallel link mechanism.

Further objects, features and advantages of the present invention will become apparent from the following detailed description of embodiments of the present invention with reference to the accompanying drawings.

DETAILED DESCRIPTION OF THE PREFERRED EMBODIMENTS

<First Embodiment>

Figure 1:
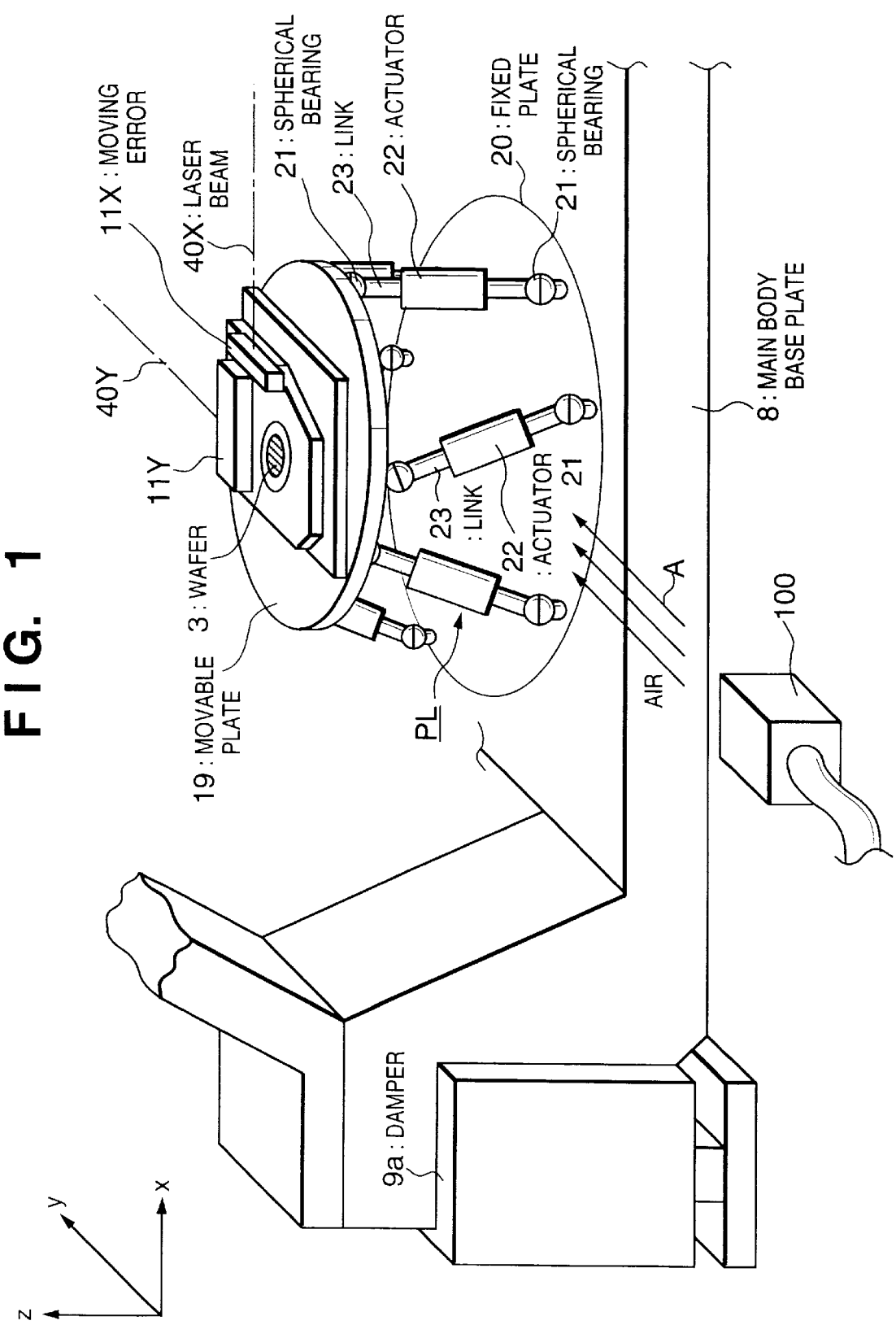
FIG. 1 is a schematic view of a semiconductor exposure apparatus according to the first embodiment.

FIG. 1 shows a semiconductor exposure apparatus according to the first embodiment of the present invention.

Referring to FIG. 1, reference numeral 8 denotes a main body base plate supported by an active support leg (damper) 9a of an active anti-vibration device. A positioning apparatus having a parallel link mechanism PL for positioning a semiconductor wafer 3 is mounted on the main body base plate 8.

The semiconductor wafer 3 is held on a lightweight and highly rigid movable plate (table) 19 consisting of a ceramic. Moving mirrors 11X and 11Y for reflecting multi-light beams (laser beams) 40X and 40Y from laser interferometers for posture measurement are also mounted on the movable plate 19. Additionally, a measurement system (not shown) which irradiates the surface of the semiconductor wafer 3 with a light beam to measure focus/leveling is arranged. That is, this semiconductor exposure apparatus has a posture measurement system for measuring the posture of the movable plate 19, which has six-degrees-of-freedom. The posture control method will be described later.

Referring to FIG. 1, the parallel link mechanism PL drives the movable plate 19 with respect to the main body base plate 8. Reference numeral 19 denotes the movable plate; 21, spherical bearings attached to the movable plate 19 and a fixed plate 20, respectively; and 22, an extendible actuator unit. In this embodiment, the main body base plate 8 serves as the fixed plate 20. However, an independent fixed plate may be set on the main body base plate. As the extendible actuator, a hydraulic actuator, an air cylinder, a combination of a motor and ball screws, or a motor, reduction gears, and ball screws, or a linear motor can be used. The spherical bearings 21 and actuator 22 unit construct a link 23. In the parallel link mechanism shown in FIG. 1, the movable plate 19 and fixed plate 20 are connected with a total of six links 23.

By controlling the extension/retraction amount of each link 23, the posture of the coordinate system $(x_1,y_1,z_1)$ of the movable plate 19, which has six-degrees-of-freedom, with respect to the coordinate system $(x_2,y_2,z_2)$ defined for the fixed plate 20 can be arbitrarily set.

The actuator unit 22 of each link 23 incorporates a position sensor (not shown). In addition, each link may have at least one of a speed sensor and an acceleration sensor as needed.

Figure 2:
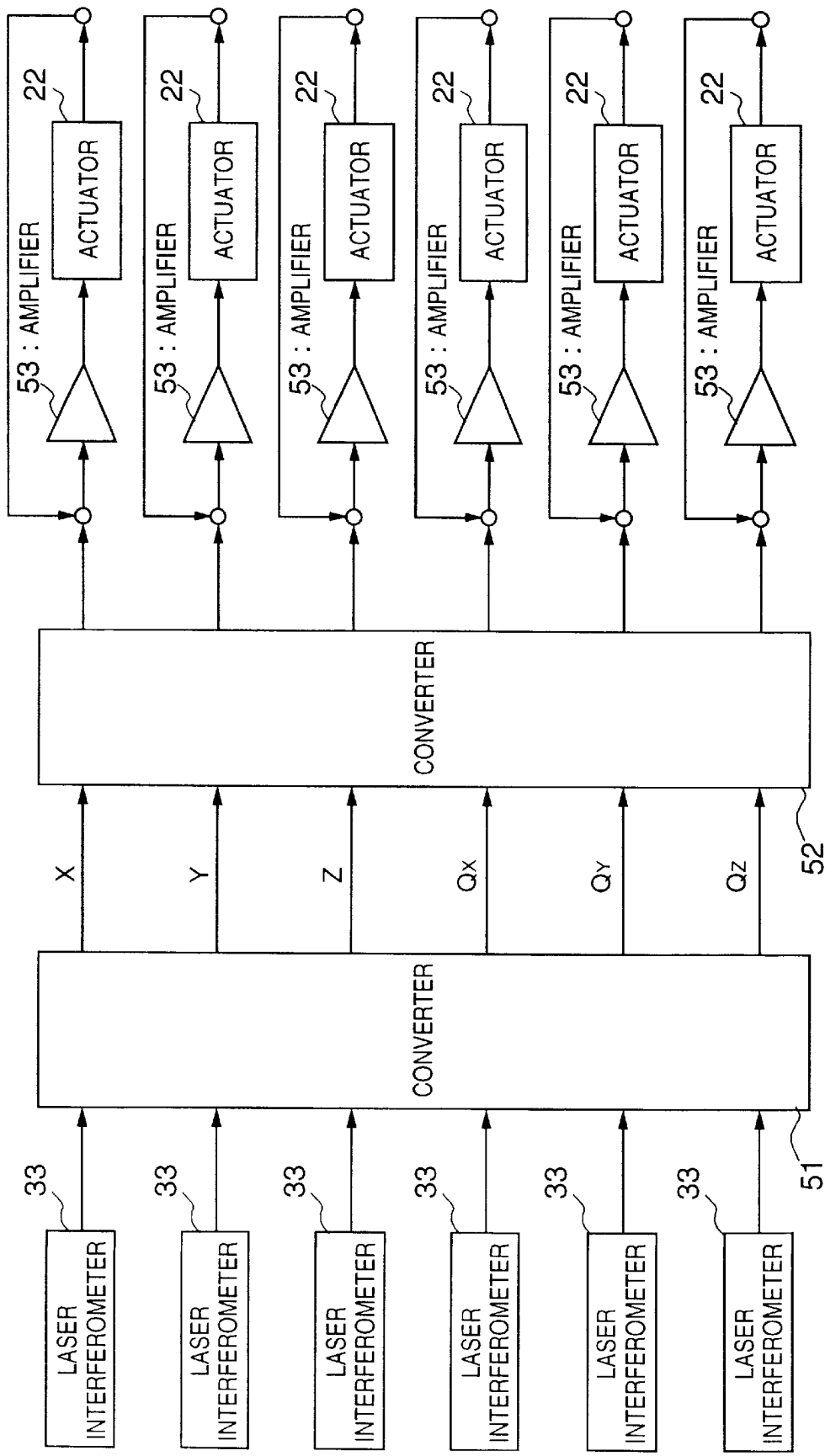
FIG. 2 is a schematic view of the control system of the semiconductor exposure apparatus according to the first embodiment.

The method of controlling the posture of the movable plate will be described next. FIG. 2 is a schematic view of the feedback control system of the positioning apparatus having a parallel link mechanism.

Signals from six laser interferometers 33 as position measurement devices are converted into position coordinates for X-, Y-, and Z-axes as the actual operation coordinate system and three rotation axes, i.e., a total of six axes by a converter 51. After this, an inverter 52 calculates (inverts) the torque or thrust to be generated by each actuator 22 of the parallel link mechanism PL. Each actuator 22 is driven on the basis of a signal obtained by amplifying the output signal from the inverter by an amplifier 53. An output signal from the speed sensor or acceleration sensor incorporated in the actuator unit as needed can be used as the signal of a minor loop formed inside the position feedback loop based on the output from the laser interferometer (position sensor) 33. The output signal from the position sensor incorporated in each actuator unit 22 can be used as a feedback signal for maintaining the posture of the movable plate 19 without causing runaway when the output from the laser interferometer 33 is stopped, i.e., when the laser beams from the laser interferometers 33, which irradiate the moving mirrors 11 on the movable plate 19, or the laser beam obliquely incident on the semiconductor wafer surface, is shielded. The output signal from the position sensor incorporated in each actuator unit 22 can also be used to perform relatively coarse positioning, instead of accurate positioning based on the output from the laser interferometer 33. With this arrangement, the movable plate 19 can be moved even to an area where measurement by the laser interferometer 33 is disabled. The exposure apparatus performs not only the semiconductor wafer exposure operation but also a handling operation of transferring the semiconductor wafer. The positioning accuracy in the handling operation can be more coarse than that in exposure. However, the semiconductor wafer 3 on the movable plate 19 must be moved outside the measurement area of the laser interferometer 33. The position sensor incorporated in the actuator unit 22 itself has an importance in this operation. In this case, the moving mirrors 11 can be made compact.

To drive the semiconductor wafer 3 by the step-and-repeat scheme on the basis of the output signal from the above-described posture measurement system, the torque or thrust to be generated by the actuator 22 of each link 23 is calculated, and drive is performed. The links are cooperatively feedback-controlled, so the movable plate 19 can be quickly set to a designated posture and positioned, and simultaneously, moved along a designated orbit at a high speed.

According to this embodiment, a drive mechanism with high rigidity can be realized by using the parallel link mechanism in the semiconductor exposure apparatus.

With this arrangement, the weight of the movable portion can be largely decreased, and high-speed and high-rigidity positioning can be performed. The problem of vibration or swing according to the drive reaction force can be largely reduced. Also, by using a movable plate of a ceramic, the weight of the movable portion can be further reduced.

In addition, according to this embodiment, since a light movable plate, even including the load, is driven, heat generated by the actuator units of the parallel link mechanism is negligible. Furthermore, in the parallel link mechanism, the actuator units can be concentrated under the movable plate 19. In the conventional drive mechanism, the stator of a linear motor is present immediately under the optical path of the laser interferometer. For this reason, heat generated by the linear motor stator causes heat fluctuation of the optical path, degrading in positioning accuracy. In this embodiment, however, since the parallel link mechanism is used as the drive mechanism, the actuators as heat sources are placed far from the optical paths of the laser interferometers. Hence, cooling and heat exhausting measures can be easily taken, and a remarkable heat measure effect can be obtained.

To easily cool the actuators, a gas flows from an air blow port 100 of a cooling unit in the direction indicated by an arrow A in FIG. 1 to cool the actuators with air. In this case, the gas preferably flows from a side surface toward the parallel link mechanism. However, the gas flow direction is not limited to this. The actuator cooling method is not limited to air cooling, either.

When the parallel link mechanism is used, the load on the actuators in step drive is almost uniformly distributed to all actuators. For this reason, a situation in which an excessive load is applied to only actuators in a specific direction can be avoided, so local heat generation can be reduced.

The position of the movable plate driven by the parallel link mechanism is measured not only by the sensors incorporated in the actuators of the parallel link mechanism but also by the laser interferometers using the moving mirrors mounted on the movable plate. Hence, the wafer mounted on the movable plate can be accurately positioned. In addition, when coarse positioning is performed using the sensors incorporated in the actuators, the movable plate can be positioned in an area where measurement by the laser interferometers is disabled, and the moving mirrors can be made compact.

The semiconductor exposure apparatus (stepper) for intermittently driving a semiconductor wafer and exposing it has been described above in detail. The present invention can also be applied to a scanning exposure apparatus (scanner) for scanning a reticle and a wafer in opposite directions at a speed ratio defined from the reduction ratio of the projection optical system and exposing the wafer. In this embodiment, the semiconductor exposure apparatus for exposing and transferring a reticle pattern to a wafer has been described. However, the present invention is not limited to the semiconductor exposure apparatus. Even when the present invention is applied to an exposure apparatus for exposing a photosensitive substrate such as a liquid crystal substrate, the same effect as described above can be obtained.

<Second Embodiment>

Figure 3:
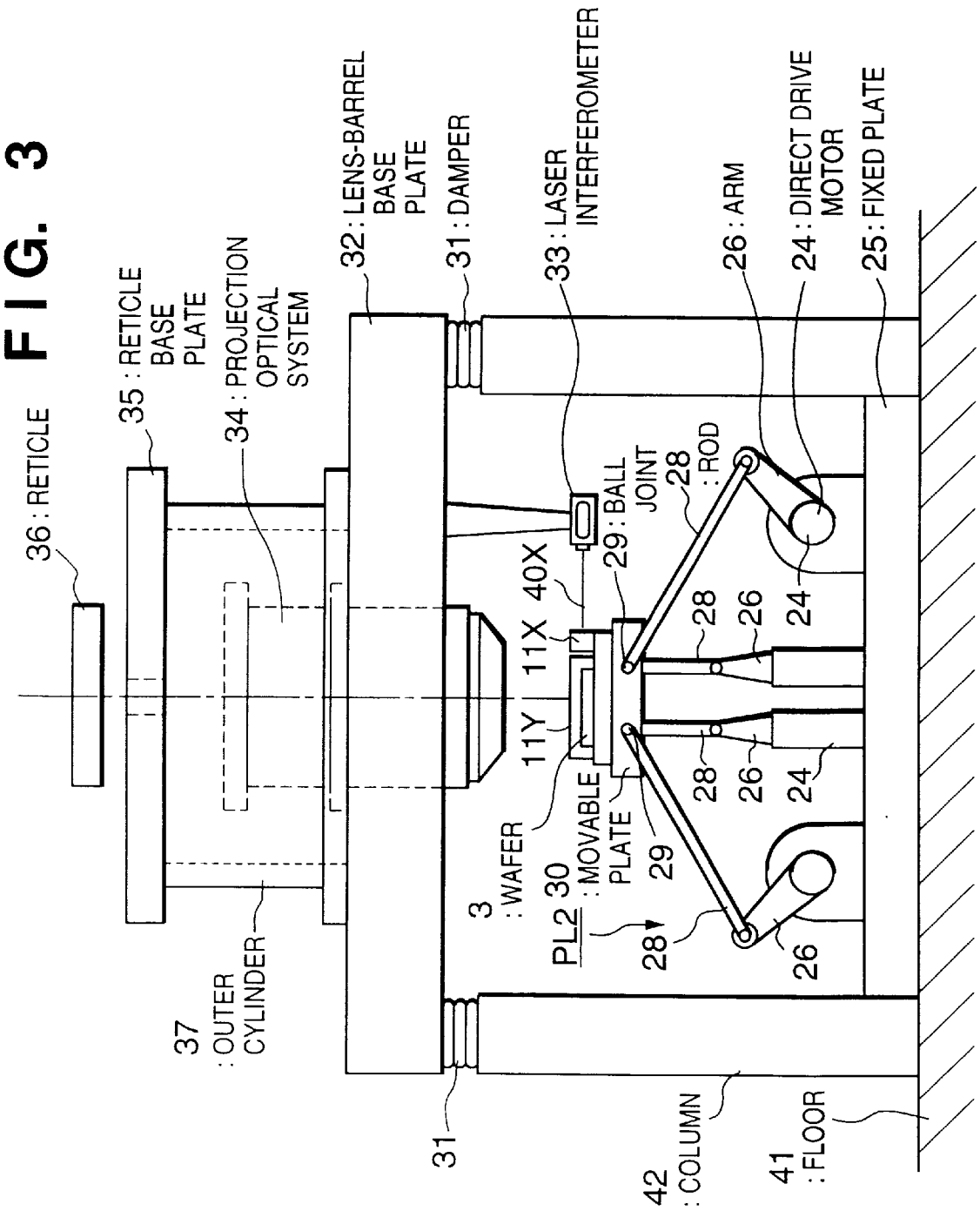
FIG. 3 is a schematic view of a semiconductor exposure apparatus according to the second embodiment.

FIG. 3 is a schematic view of a semiconductor exposure apparatus according to the second embodiment of the present invention.

In the first embodiment, the parallel link mechanism is arranged on the main body base plate supported by the active anti-vibration device. In this embodiment, the fixed plate of a parallel link mechanism is directly placed on a floor without inserting any anti-vibration members, and a movable plate is position-controlled on the basis of the output from a laser interferometer mounted on a lens-barrel base plate for supporting a projection optical system. The lens-barrel base plate is supported by the floor through dampers having an anti-vibration function.

Referring to FIG. 3, reference numeral 3 denotes a wafer placed on a movable plate 30 consisting of a ceramic. Moving mirrors 11X and 11Y are held on the movable plate 30. A parallel link mechanism PL2 drives the movable plate. The parallel link mechanism of this embodiment will be described later. A fixed plate 25 of the parallel link mechanism is directly placed on a floor 41 without inserting any anti-vibration members, unlike the first embodiment. A lens-barrel base plate 32 supporting a projection optical system 34 is supported by columns 42 through dampers 31 so as to be independent of vibration of the fixed plate. A reticle 36 is supported by a reticle base plate 35. The reticle base plate 35 is fixed to the lens-barrel base plate 32.

Figure 4:
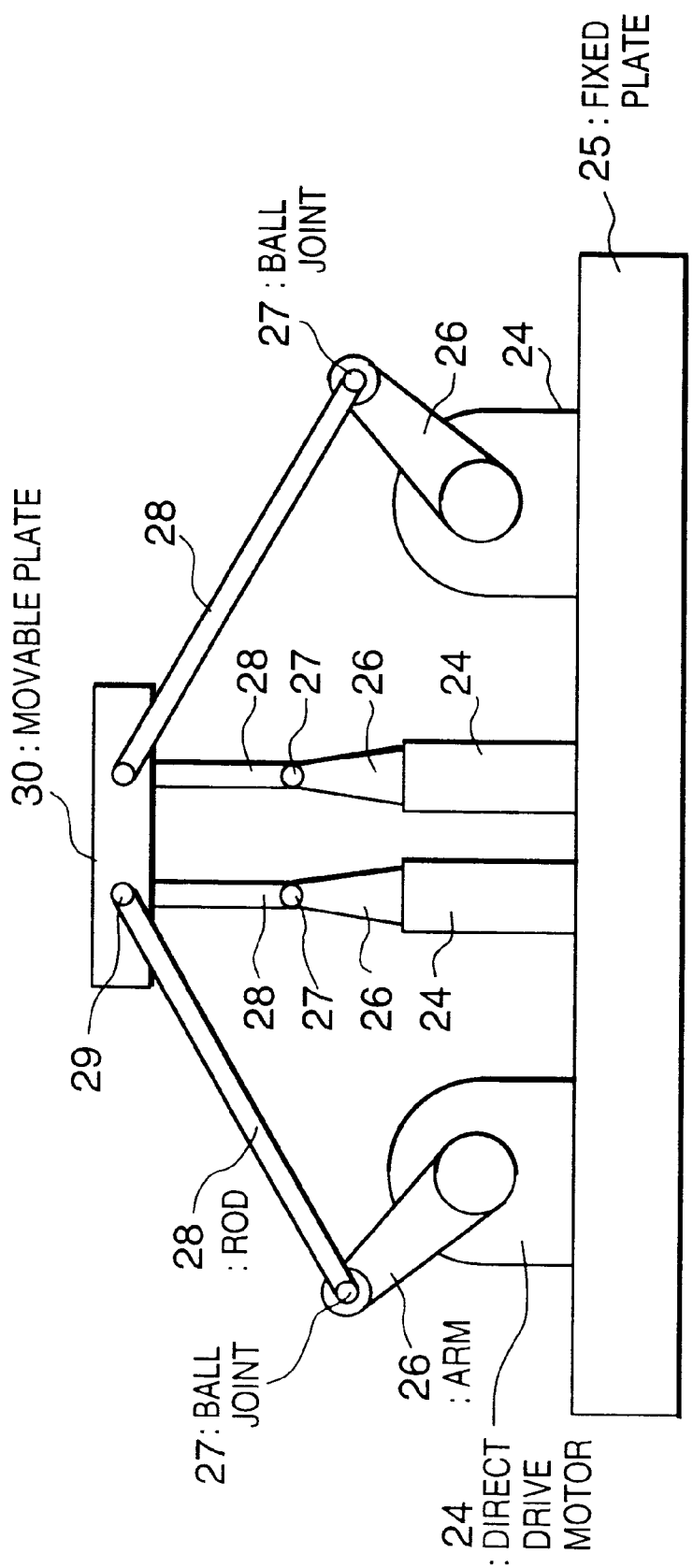
FIG. 4 is an explanatory view of a parallel link mechanism used in the semiconductor exposure apparatus according to the second embodiment.
Figure 5:
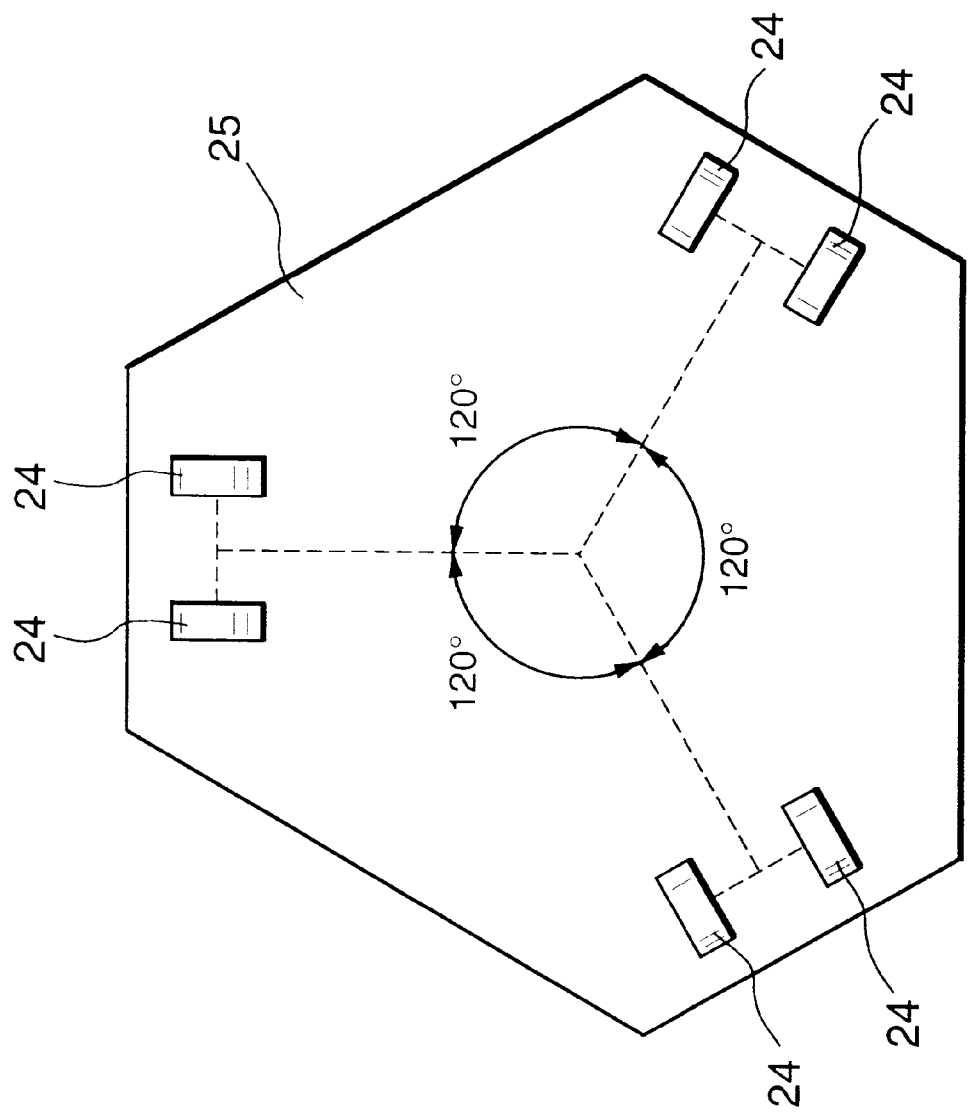
FIG. 5 is a plan view of the parallel link mechanism used in the semiconductor exposure apparatus according to the second embodiment.

The parallel link mechanism used in the second embodiment is different from that used in the first embodiment. FIGS. 4 and 5 are schematic views of the parallel link mechanism used in this embodiment.

Referring to FIG. 5, to make the movable plate lightweight, three pairs of direct drive motors (DD motors) 24 for rotary drive, i.e., a total of six DD motors are arranged on the fixed plate at an angular interval of 120°.

Referring to FIG. 4, an arm 26 is attached to each DD motor 24 to be driven in the rotational direction of the DD motor 24. A ball joint 27 is attached to the distal end on the opposite side of the arm 26 connected to the DD motor 24, and a rod 28 is connected to the ball joint 27. The other end of the rod 28 is connected to the movable plate 30 of a ceramic through a second ball joint 29. With this parallel link mechanism, the movable plate 30 can be positioned with six-degrees-of-freedom.

As in the parallel link mechanism used in the above-described first embodiment, the DD motor 24 has a rotary encoder as a standard position sensor. The movable plate can be positioned using the position sensor of each DD motor 24, instead of positioning based on the measured position signal from the laser interferometer for the moving mirror 11X or the like shown in FIG. 3. The DD motor 24 may have not only the encoder but also a speed sensor as needed. When a minor feedback loop using this signal is formed, damping can be imparted to increase the stability. Even when the speed sensor is arranged on the arm 26 or rod 28, and a feedback loop using the signal is formed, the stability can be increased.

In this embodiment, the stepper shown in FIG. 3 is constituted using the above-described parallel link mechanism. In this embodiment, the projection optical system 34 is mounted on the lens-barrel base plate 32 constituting a quasi-absolute stationary system supported by the passive or active dampers 31. The reticle base plate 35 on which the reticle 36 is mounted is placed on an outer cylinder 37 firmly connected to the lens-barrel base plate 32.

The parallel link mechanism PL2 shown in FIG. 4 or 5 is set on the apparatus set foundation (floor) 41 without inserting any dampers.

When the moving mirror 11X is irradiated with a laser beam 40X from a laser interferometer 33, the position of the movable plate 30 in the X direction is measured. When the moving mirror 11Y is irradiated with a laser beam from a laser interferometer (not shown), the position of the movable plate 30 in the Y direction is measured. On the basis of these outputs, the movable plate 30 moves while tracking the position.

The structure of the semiconductor exposure apparatus of this embodiment may be employed as an exposure apparatus, and the parallel link mechanism of the first embodiment may be used as the wafer drive system. Conversely, the structure of the semiconductor exposure apparatus of the first embodiment may be employed as an exposure apparatus, and the parallel link mechanism of this embodiment may be used as the wafer drive system.

In addition to the effect obtained by the first embodiment, the exposure apparatus of the second embodiment provides an effect that the reaction force generated upon driving the parallel link mechanism is prevented from being transmitted to the lens-barrel base plate because the fixed plate and lens-barrel base plate of the parallel link mechanism are independent. Hence, generation factors for positioning errors or alignment errors can be largely decreased.

In the first embodiment, since a reaction force is generated in the main body base plate, the main body base plate must have high rigidity. However, in the apparatus arrangement of the second embodiment, since this necessity is small, an increase in weight of the entire apparatus can be prevented, unlike the first embodiment.

The semiconductor exposure apparatus (stepper) for intermittently driving a semiconductor wafer and exposing it has been described above in detail. The present invention can also be applied to a scanning exposure apparatus (scanner) for scanning a reticle and a wafer in opposite directions at a speed ratio defined from the reduction ratio of the projection optical system and exposing the wafer. In this embodiment, the semiconductor exposure apparatus for exposing and transferring a reticle pattern to a wafer has been described. However, the present invention is not limited to the semiconductor exposure apparatus. Even when the present invention is applied to an exposure apparatus for exposing a photosensitive substrate such as a liquid crystal substrate, the same effect as described above can be obtained.

<Third Embodiment>

Figure 6:
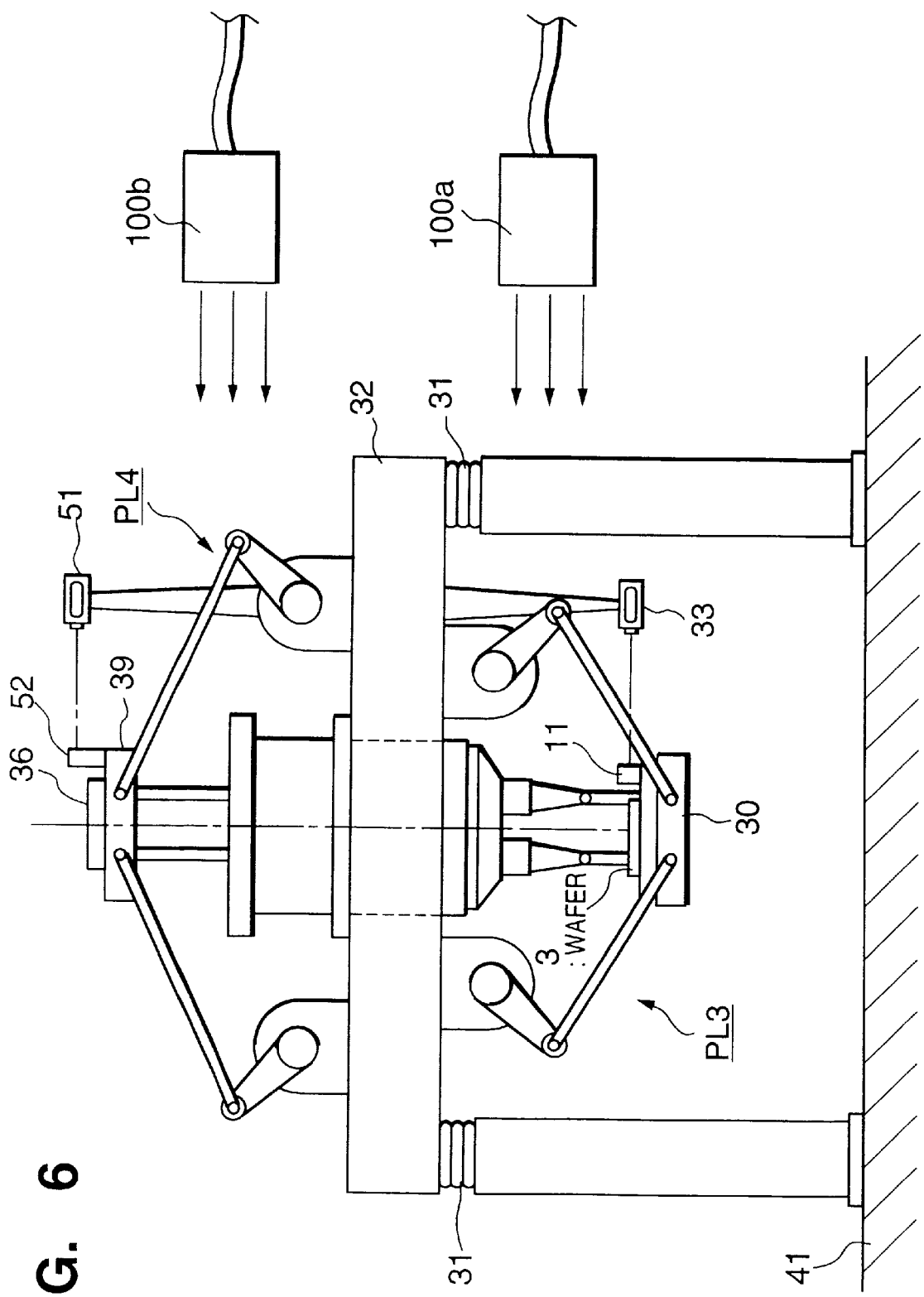
FIG. 6 is a schematic view of a semiconductor exposure apparatus according to the third embodiment.
Figure 7:
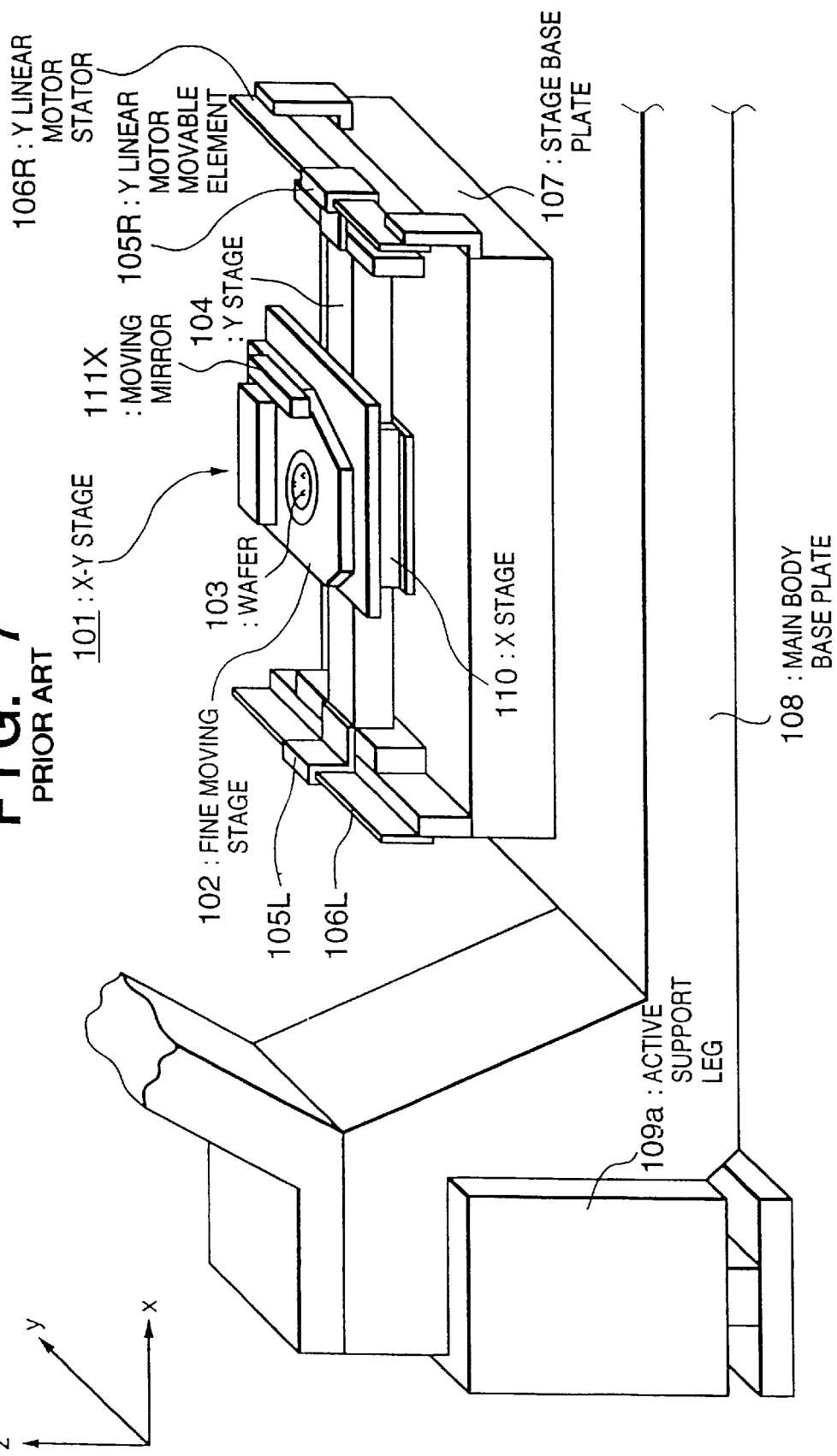
FIG. 7 is a schematic view of a conventional semiconductor exposure apparatus.
Figure 8:
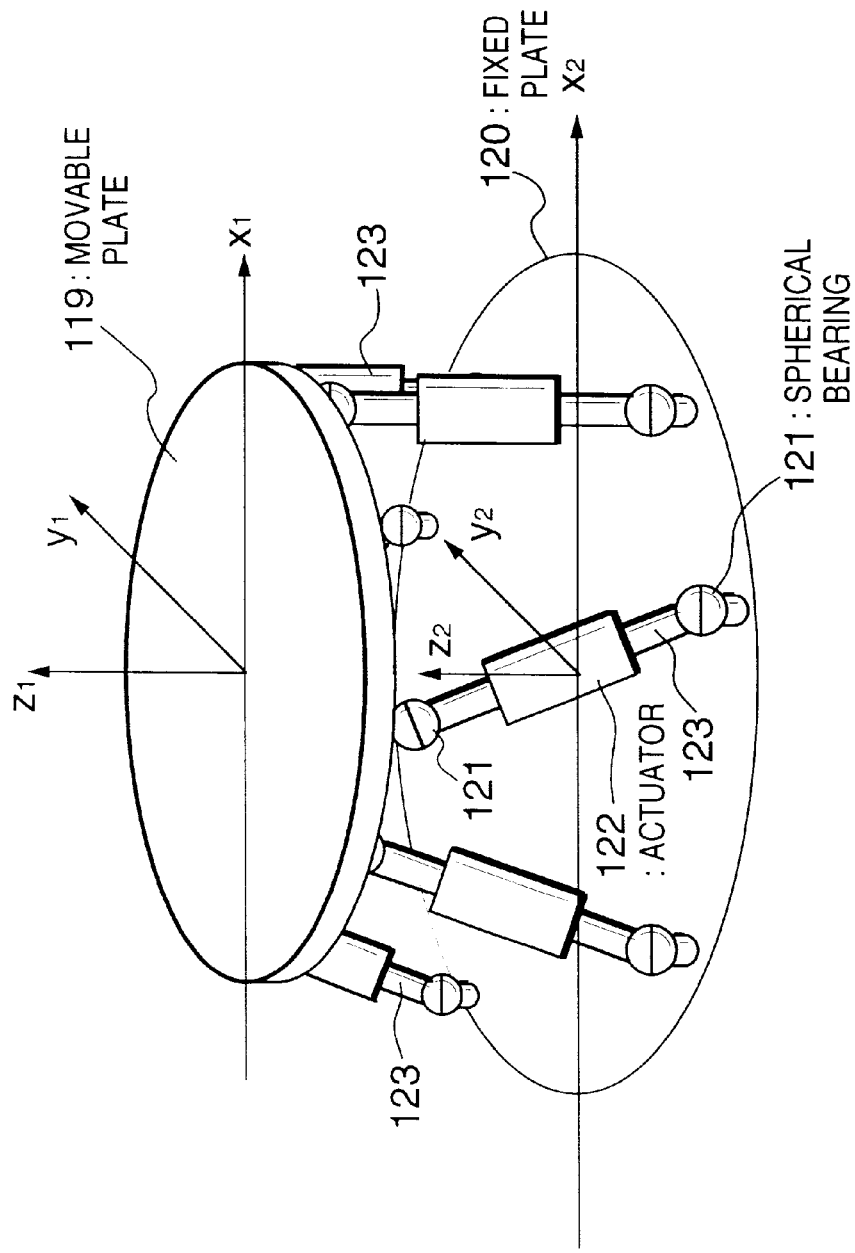
FIG. 8 is an explanatory view of a parallel link mechanism.

FIG. 6 is a schematic view of a semiconductor exposure apparatus according to the third embodiment of the present invention.

In this embodiment, a parallel link is employed for the reticle stage drive system of a scanning exposure apparatus. Additionally, in this embodiment, the fixed plate of the parallel link mechanism is fixed to a lens-barrel base plate supporting a projection optical system, thereby constructing the parallel link mechanism.

Referring to FIG. 6, reference numeral 3 denotes a wafer held on a movable plate 30 made of a ceramic. A moving mirror 11 is held on the movable plate 30. A parallel link mechanism PL3 drives the movable plate. A reticle 36 is placed on a reticle movable plate 39 consisting of a ceramic. A parallel link mechanism PL4 drives the reticle movable plate 39. A projection optical system 34 is supported by a lens-barrel base plate 32. The two parallel link mechanisms PL3 and PL4 are fixed to the lens-barrel base plate 32. Reference numerals 100a and 100b denote air blow ports of a cooling unit for supplying a cooled gas from one side to the actuators of the parallel link mechanisms PL3 and PL4.

The position of the movable plate 30 on the wafer side is measured by irradiating the moving mirror 11 placed on the movable plate 30 with a light beam from a laser interferometer 33 arranged on the lens-barrel base plate 32. On the reticle side as well, a laser interferometer 51 is placed on the lens-barrel base plate 32, and a moving mirror 52 is held on the reticle movable plate 39. The position of the reticle movable plate is measured by this structure. That is, on both the wafer and reticle sides, positions are measured with reference to the lens-barrel base plate 32.

The posture control method by the parallel link mechanism of the movable plate is the same as in the above-described embodiments. The movable plate on the reticle side is also controlled by the same method as described above.

In the scanning exposure apparatus of this embodiment, the reticle and wafer are scanned in opposite directions at a speed ratio obtained from the reduction ratio of the projection optical system and exposed. In this embodiment, both the fixed plate of the parallel link mechanism on the reticle side and the fixed plate of the parallel link mechanism on the wafer side are fixed to the lens-barrel base plate, and position measurement is performed with reference to the lens-barrel base plate. Since the relative positional shift between the reticle and wafer due to swing of the lens-barrel base plate or the like can be prevented, scanning exposure can be performed at a higher accuracy.

In addition to this effect, the effects of the first and second embodiments can also be obtained by the third embodiment.

To drive the wafer-side structure in the first or second embodiment, the movable plate on which a wafer is placed may be driven by a parallel link mechanism placed on the lens-barrel base plate, as in the third embodiment.

The third embodiment can be modified to an arrangement for driving only one of the wafer movable plate and reticle movable plate by the parallel link mechanism.

A device manufacturing method according to a preferred embodiment of the present invention comprises the steps of applying a resist on a wafer, transferring a reticle pattern to the wafer using an exposure apparatus of any one of the first to third embodiments, and developing the wafer.

According to an exposure apparatus of one embodiment of the present invention, a photosensitive substrate or reticle can be positioned at high speed, high accuracy, and high rigidity. Since the heat source of the parallel link mechanism is separated from the reticle or photosensitive substrate, the thermal distortion of the reticle or photosensitive substrate can be minimized. As compared to the conventional drive mechanism for driving a reticle or photosensitive substrate, employment of the parallel link mechanism especially allows to largely reduce the weight of the movable portion. Hence, the problem of vibration or swing according to the drive reaction force can be largely reduced. In addition, the load on the actuators in driving the table is almost uniform.

According to an exposure apparatus of one embodiment of the present invention, the plate can be positioned with respect to the projection optical system using the lens-barrel base plate as a reference. Especially when both the first and second parallel link mechanisms are supported through the lens-barrel base plate, highly accurate exposure can be performed because both tables use the lens-barrel base plate as a reference.

According to an exposure apparatus of one embodiment of the present invention, the position of an object to be positioned is directly measured, unlike the prior art in which position measurement is performed using a position sensor incorporated in an actuator of the parallel link. For this reason, accurate position information of the object can be obtained.

According to an exposure apparatus of one embodiment of the present invention, since the parallel link mechanism is driven on the basis of the measurement result by a measurement device such as an interferometer, a reticle or photosensitive substrate can be accurately positioned, so highly accurate exposure can be performed.

According to an exposure apparatus of one embodiment of the present invention, accurate position information of a reticle or photosensitive substrate can be obtained by an interferometer. In the present invention, since the parallel link mechanism is used, the heat source is separated from the measurement position. For this reason, air fluctuation which may generate measurement errors of the interferometer rarely occurs in the measurement optical path, so highly accurate position measurement can be performed.

According to an exposure apparatus of one embodiment of the present invention, since the interferometer and parallel link mechanism are supported by a common base plate, the relative shift between the interferometer and parallel link mechanism can be prevented, and highly accurate position measurement can be performed.

According to an exposure apparatus of one embodiment of the present invention, since the actuators of the parallel link mechanism have position sensors or the like, relatively coarse positioning can be performed using the position sensors. Especially, when coarse positioning suffices outside the measurement area of the interferometer, the moving mirror for the interferometer can be made compact, and the object to be driven can be made lightweight. Hence, an exposure apparatus with a high throughput can be provided.

According to an exposure apparatus of one embodiment of the present invention, a cooling unit is arranged to minimize thermal distortion or air fluctuation, so highly accurate positioning can be performed. Particularly, since the present invention uses the parallel link mechanism, heat generation by the actuators is minimum and uniform. Since the heat source is positioned under the table, a relatively simple cooling unit can be used.

According to an exposure apparatus of one embodiment of the present invention, since air cooling is used, the cooling unit can be simple. In addition, when a gas is supplied from one side, the reticle, wafer, or moving mirror on the table is not influenced by thermal distortion or air fluctuation.

According to an exposure apparatus of one embodiment of the present invention, the weight of the movable portion can be further reduced by using a ceramic table, so an exposure apparatus having a high-speed positioning mechanism with high rigidity can be provided.

When the exposure apparatus of the present invention is used, a device can be manufactured at a high speed.

According to an exposure apparatus of one embodiment of the present invention, the first object (e.g., a reticle) and the second object (e.g., a substrate) can be accurately positioned with respect to the third object (e.g., a projection optical system) using a common base plate as a reference.

According to an exposure apparatus of one embodiment of the present invention, since the positions of the first and second objects are measured with reference to a common base plate, no relative shift occurs in position measurement, so the first and second objects can be accurately positioned with respect to the third object.

According to an exposure apparatus of one embodiment of the present invention, since not position sensors incorporated in the actuators of a parallel link as in the prior art but a measurement device for directly measuring the position of a plate on which an object to be positioned is held is used, accurate position information of the object can be obtained.

The present invention is not limited to the above embodiments and various changes and modifications can be made within the spirit and scope of the present invention. Therefore, to apprise the public of the scope of the present invention, the following claims are made.

What is claimed is:

1. An exposure apparatus for transferring a reticle pattern to a substrate, comprising:
    a movable plate for supporting the substrate;
    a parallel link mechanism for positioning said plate;
    a fixed plate for supporting said parallel link mechanism;
    a projection optical system;
    a lens-barrel base plate for supporting said projection optical system; and
    a damper for preventing vibration transmission between said fixed plate and said lens-barrel base plate.

2. An exposure apparatus for transferring a reticle pattern to a substrate, said apparatus comprising:
    a plate for supporting the substrate or reticle;
    a parallel link mechanism for positioning said plate;
    a base plate for supporting said parallel link mechanism; and
    a damper for supporting said base plate.

3. The apparatus according to claim 2, further comprising:
    a measurement device for measuring a position of said plate; and
    a drive section for driving said parallel link mechanism on the basis of a measurement result by said measurement device.

4. An exposure apparatus for transferring a reticle pattern to a substrate, said apparatus comprising:
    a plate for supporting the substrate or reticle;
    a parallel link mechanism for positioning said plate;
    a measurement device for measuring a position of said plate, wherein said measurement device comprises a reflecting mirror fixed to said plate, and an interferometer paired with said reflecting mirror; and
    a drive section for driving said parallel link mechanism on the basis of a measurement result by said measurement device.

5. The apparatus according to claim 4, wherein said interferometer is fixed to a base plate for supporting said parallel link mechanism.

6. The apparatus according to claim 4, wherein said parallel link mechanism comprises:
    a plurality of actuators; and
    at least one of a position sensor, a speed sensor, and an acceleration sensor.

7. The apparatus according to claim 6, wherein said actuator has one of an extendible mechanism and a rotation mechanism.

8. An exposure apparatus for transferring a reticle pattern to a substrate, said apparatus comprising:

a plate for supporting the substrate or reticle;

a parallel link mechanism, having a plurality of actuators, for positioning said plate; and a cooling unit for cooling said plurality of actuators.

9. The apparatus according to claim 8, wherein said cooling unit comprises an air cooling unit.

10. The apparatus according to claim 9, wherein said air cooling unit supplies a gas from one side of said parallel link mechanism to said parallel link mechanism.

11. An exposure apparatus for transferring a reticle pattern to a substrate, said apparatus comprising:

a plate for supporting the substrate or reticle, wherein said plate is formed from a ceramic; and a parallel link mechanism for positioning said plate.

12. An exposure apparatus for transferring a reticle pattern to a substrate, said apparatus comprising:

a first plate for supporting the particle;

a second plate for supporting the substrate;

a first parallel link mechanism for positioning said first plate; and a second parallel link mechanism for positioning said second plate, wherein said first and second parallel link mechanisms are supported by a lens-barrel base plate for supporting a projection optical system.

13. The apparatus according to claim 12, further comprising a damper for supporting said lens-barrel base plate.

14. An exposure apparatus for transferring a reticle pattern to a substrate, said apparatus comprising:

a movable plate for supporting the substrate;

a parallel link mechanism for positioning said plate;

a fixed plate for supporting said parallel link mechanism;

a projection optical system;

a lens-barrel base plate for supporting said projection optical system; and a damper for preventing vibration transmission between said fixed plate and said lens-barrel base plate.

15. A positioning apparatus for positioning first and second objects, said apparatus comprising:

a first plate for supporting the first object;

a second plate for supporting the second object;

a first parallel link mechanism for positioning said first plate;

a second parallel link mechanism for positioning said second plate;

a common base plate for supporting said first and second parallel link mechanisms;

a first measurement device for measuring a position of said first plate;

a second parallel link mechanism for positioning said second plate;

a common base plate for supporting said first and second parallel link mechanisms;

a first measurement device for measuring a position of said first plate;

a second measurement device for measuring a position of said second plate;

a first drive section for driving said first parallel link mechanism on the basis of a measurement result by said first measurement device; and a second drive section for driving said second parallel link mechanism on the basis of a measurement result by said second measurement device, wherein said first and second measurement devices measure the positions of said first and second plates with reference to said common base plate, respectively, and each of said first and second measurement devices has an interferometer.

16. A positioning apparatus for positioning first and second objects, said apparatus comprising:

a first plate for supporting the first object;

a second plate for supporting the second object;

a first parallel link mechanism for positioning said first plate;

a second parallel link mechanism for positioning said second plate; and a common base plate for supporting said first and second parallel link mechanisms, wherein said first and second plates are formed from a ceramic.

17. A positioning apparatus for positioning first and second objects, said apparatus comprising:

a first plate for supporting the first object;

a second plate for supporting the second object;

a first parallel link mechanism for positioning said first plate;

a second parallel link mechanism for positioning said second plate; and a common base plate for supporting said first and second parallel link mechanisms, wherein the first object comprises a reticle, and the second object comprises a substrate.

18. The apparatus according to claim 17, wherein said common base plate comprises a lens-barrel base plate for supporting a projection optical system.

19. A positioning apparatus for positioning first and second objects, said apparatus comprising:

a first plate for supporting the first object;

a second plate for supporting the second object;

a first parallel link mechanism, having a plurality of actuators, for positioning said first plate;

a second parallel link mechanism, having a plurality of actuators, for positioning said second plate;

a common base plate for supporting said first and second parallel link mechanisms; and a cooling unit for cooling said plurality of actuators of said first and second parallel link mechanisms.

20. The apparatus according to claim 19, wherein said cooling unit comprises an air cooling unit.

21. The apparatus according to claim 20, wherein said air cooling unit supplies a gas from one side of said first and second parallel link mechanisms to said first and second parallel link mechanisms.

22. A positioning apparatus comprising:

a plate for supporting an object to be positioned;

a parallel link mechanism for positioning said plate;

a measurement device for measuring a position of said plate outside said parallel link mechanism, wherein said measurement device comprises a reflecting mirror fixed to said plate, and an interferometer paired with said reflecting mirror; and a drive section for driving said parallel link mechanism on the basis of a measurement result by said measurement device.

23. A positioning apparatus comprising:

a plate for supporting an object to be positioned, wherein said plate is formed from a ceramic;

a parallel link mechanism for positioning said plate;

a measurement device for measuring a position of said plate outside said parallel link mechanism; and a drive section for driving said parallel link mechanism on the basis of a measurement result by said measurement device.

24. A positioning apparatus comprising:

a plate for supporting an object to be positioned;

a parallel link mechanism, having a plurality of actuators, for positioning said plate;

a measurement device for measuring a position of said plate outside said parallel link mechanism;

a drive section for driving said parallel link mechanism on the basis of a measurement result by said measurement device; and a cooling unit for cooling said plurality of actuators.

25. The apparatus according to claim 24, wherein said cooling unit comprises an air cooling unit.

26. The apparatus according to claim 25, wherein said air cooling unit supplies a gas from one side of said parallel link mechanism to said parallel link mechanism.

* * * * *

UNITED STATES PATENT AND TRADEMARK OFFICE
CERTIFICATE OF CORRECTION

PATENT NO. : 6,327,026 B1
DATED : December 4, 2001
INVENTOR(S) : Shinji Wakui

It is certified that error appears in the above-identified patent and that said Letters Patent is hereby corrected as shown below:

<u>Column 2,</u>
Line 17, ""(1996)." should read -- (3/1996). --.
Line 23, "a" should read -- an --.

<u>Column 3,</u>
Line 35, "a" should read -- an --.

<u>Column 12,</u>
Line 6, "not" should be deleted.
Line 7, "art" should read -- art are not used, --.

Signed and Sealed this

Seventh Day of May, 2002

JAMES E. ROGAN
*Director of the United States Patent and Trademark Office*

*Attest:*

*Attesting Officer*